(12) United States Patent
Ghaderi et al.

(10) Patent No.: US 12,709,538 B2
(45) Date of Patent: Aug. 18, 2026

(54) DEVICE WITH A STRESS DECOUPLING STRUCTURE

(71) Applicant: Infineon Technologies AG, Neubiberg (DE)

(72) Inventors: Mohammadamir Ghaderi, Regensburg (DE); David Tumpold, Kirchheim b. Munich (DE)

(73) Assignee: Infineon Technologies AG, Neubiberg (DE)

( * ) Notice: Subject to any disclaimer, the term of this patent is extended or adjusted under 35 U.S.C. 154(b) by 375 days.

(21) Appl. No.: 18/514,728

(22) Filed: Nov. 20, 2023

(65) Prior Publication Data

US 2024/0166495 A1 May 23, 2024

(30) Foreign Application Priority Data

Nov. 21, 2022 (EP) .................................... 22208533

(51) Int. Cl.
*B81B 3/00* (2006.01)
*B81B 7/00* (2006.01)

(52) U.S. Cl.
CPC .......... *B81B 3/0081* (2013.01); *B81B 3/0078* (2013.01); *B81B 7/0093* (2013.01); *B81B 2201/042* (2013.01); *B81B 2203/0127* (2013.01); *B81B 2203/0163* (2013.01)

(58) Field of Classification Search
CPC ... B81B 3/0081; B81B 3/0078; B81B 7/0093; B81B 2201/042; B81B 2203/0127; B81B 2203/0163; B81B 3/0072; B81B 7/02; B81B 7/0048
See application file for complete search history.

(56) References Cited

U.S. PATENT DOCUMENTS

| | | | | |
|---|---|---|---|---|
| 6,483,111 | B1 * | 11/2002 | Ishikawa | G01J 5/20 250/338.4 |
| 10,981,782 | B2 * | 4/2021 | Yon | B81C 1/00325 |
| 2002/0067663 | A1 * | 6/2002 | Loeppert | B81B 3/0072 367/181 |
| 2004/0053435 | A1 * | 3/2004 | Ikushima | B81C 1/00047 438/57 |
| 2009/0092273 | A1 * | 4/2009 | Zhe | H04R 19/04 381/361 |

(Continued)

FOREIGN PATENT DOCUMENTS

EP 3595403 A1 1/2020

OTHER PUBLICATIONS

Yoon et al., "A Highly Reliable MEMS Relay with Two-Step Spring System and Heat Sink Insulator for High-Power Switching Applications," Journal of Microelectromechanical Systems, IEEE Service Center, vol. 25, No. 1, Feb. 1, 2016, pp. 217-226, XP011597863.

*Primary Examiner* — Bitew A Dinke
(74) *Attorney, Agent, or Firm* — Slater Matsil, LLP

(57) ABSTRACT

A MEMS device comprises a suspended membrane structure having an inner membrane section and an outer membrane section. The outer membrane section surrounds the inner membrane section. The membrane structure comprises an elastically deformable spring structure in the outer membrane section, such that the spring structure is arranged to convert a thermal-induced compressive stress in the suspended membrane structure into a spring displacement.

20 Claims, 11 Drawing Sheets

(56) References Cited

U.S. PATENT DOCUMENTS

| | | | | |
|---|---|---|---|---|
| 2013/0221456 | A1* | 8/2013 | Li | B81B 3/0018 257/416 |
| 2013/0346015 | A1* | 12/2013 | Yamanaka | G01C 19/5747 702/141 |
| 2014/0133685 | A1* | 5/2014 | Liu | H04R 3/005 381/174 |
| 2014/0264712 | A1* | 9/2014 | Boutami | H10F 71/00 438/54 |
| 2015/0041928 | A1* | 2/2015 | Partridge | B81B 7/007 438/51 |
| 2015/0116806 | A1* | 4/2015 | Mizoguchi | G02B 26/0858 359/199.4 |
| 2016/0332865 | A1* | 11/2016 | Chen | B81B 3/0054 |
| 2017/0247244 | A1 | 8/2017 | Dehe | |
| 2019/0023562 | A1* | 1/2019 | Fueldner | B81C 1/00182 |
| 2019/0241428 | A1 | 8/2019 | Mitchell et al. | |
| 2021/0176828 | A1* | 6/2021 | Imboden | H05B 3/141 |
| 2021/0179419 | A1* | 6/2021 | Cheng | G01C 19/5769 |
| 2023/0045563 | A1* | 2/2023 | Lee | B81B 7/0038 |
| 2023/0063234 | A1* | 3/2023 | Chen | H04R 7/04 |
| 2025/0326628 | A1* | 10/2025 | Shibano | B81C 1/00658 |

* cited by examiner

100
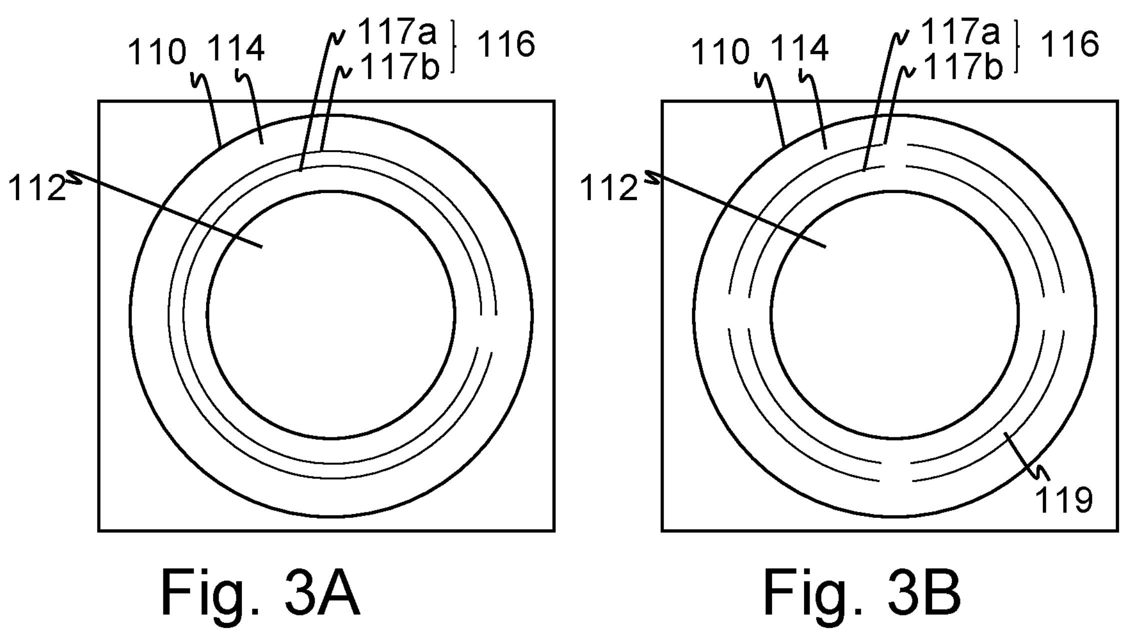
Fig. 3A
Fig. 3B
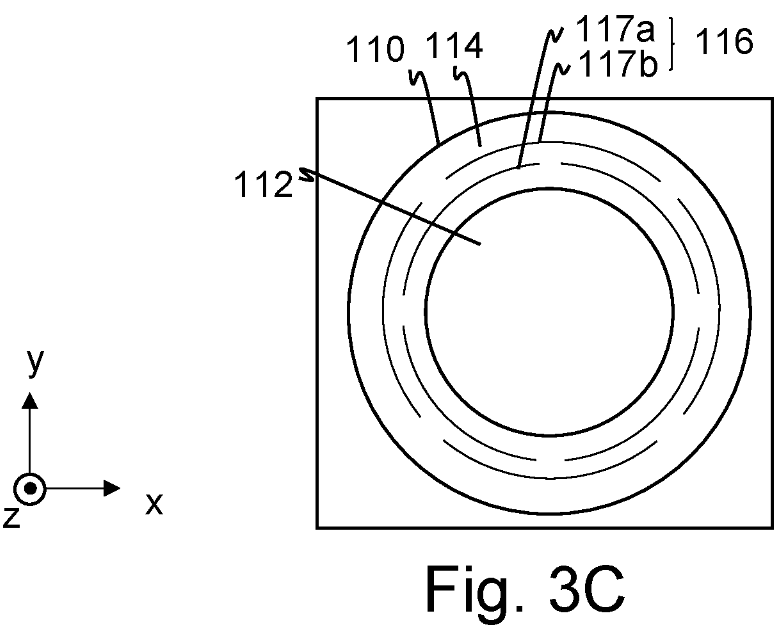
Fig. 3C

100

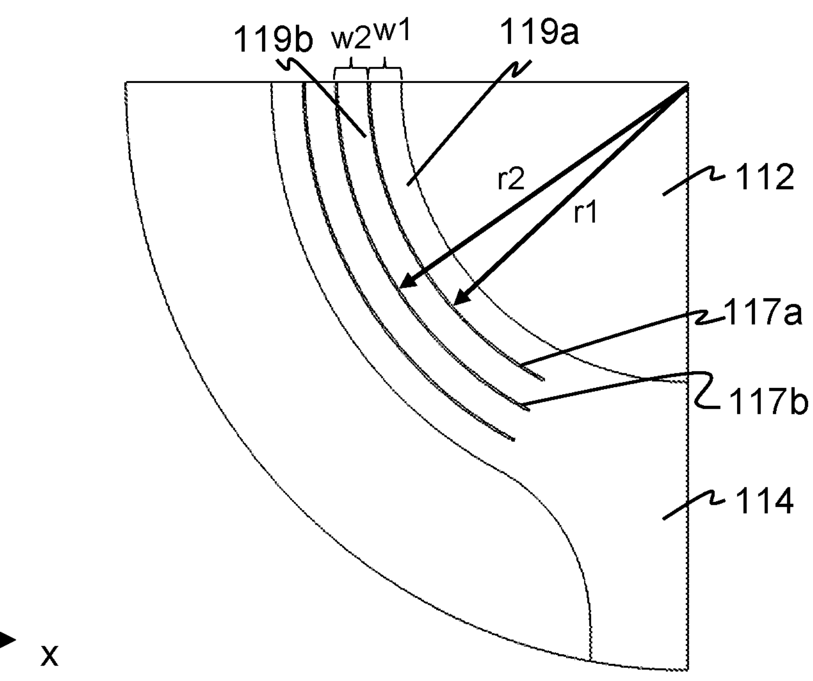
Fig. 7A
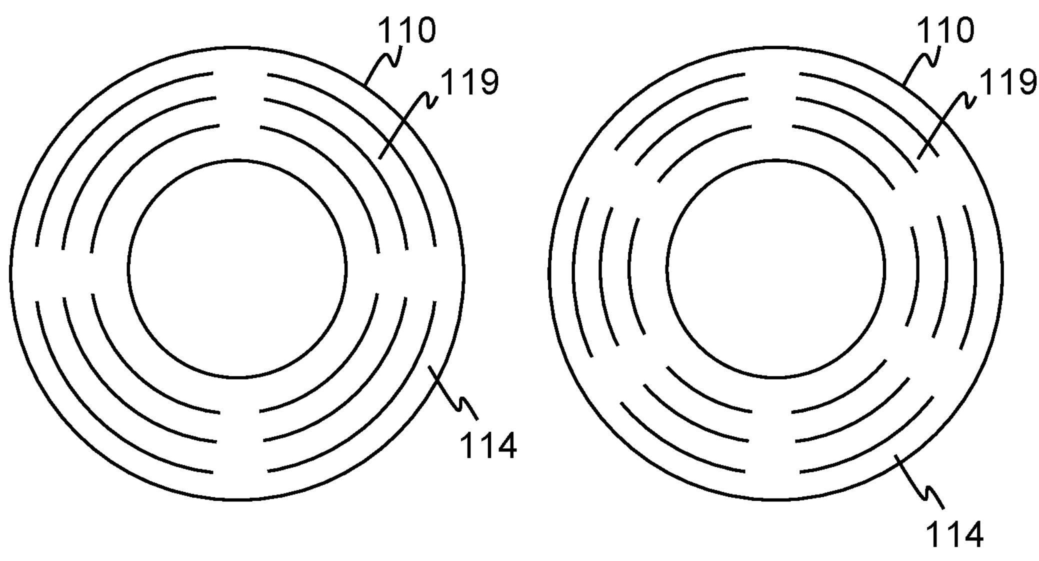
Fig. 7B
Fig. 7C

200
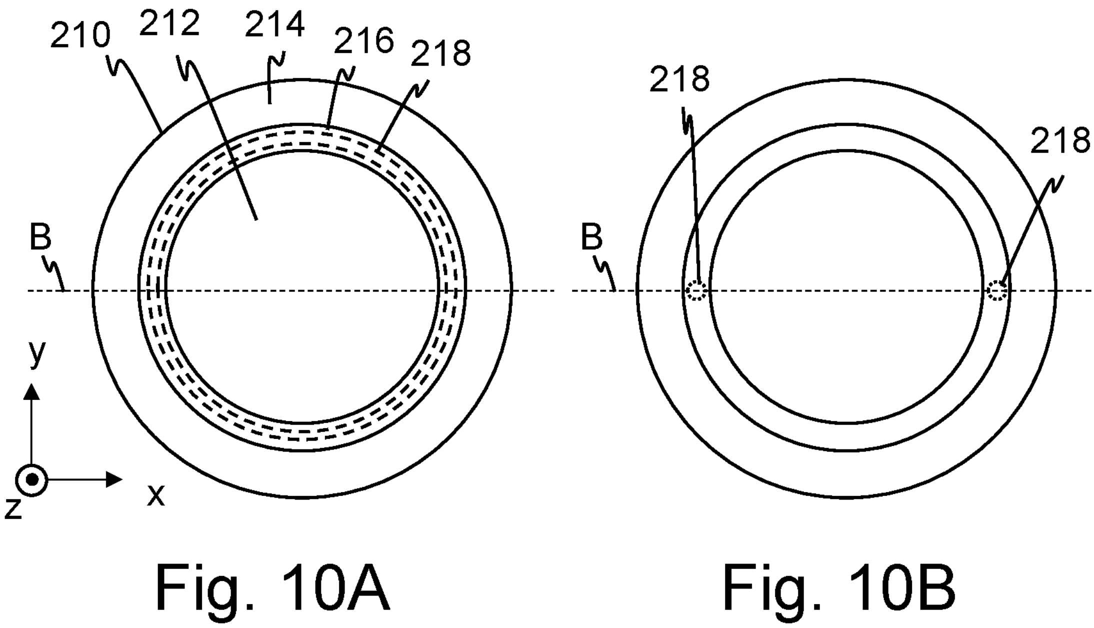
Fig. 10A
Fig. 10B
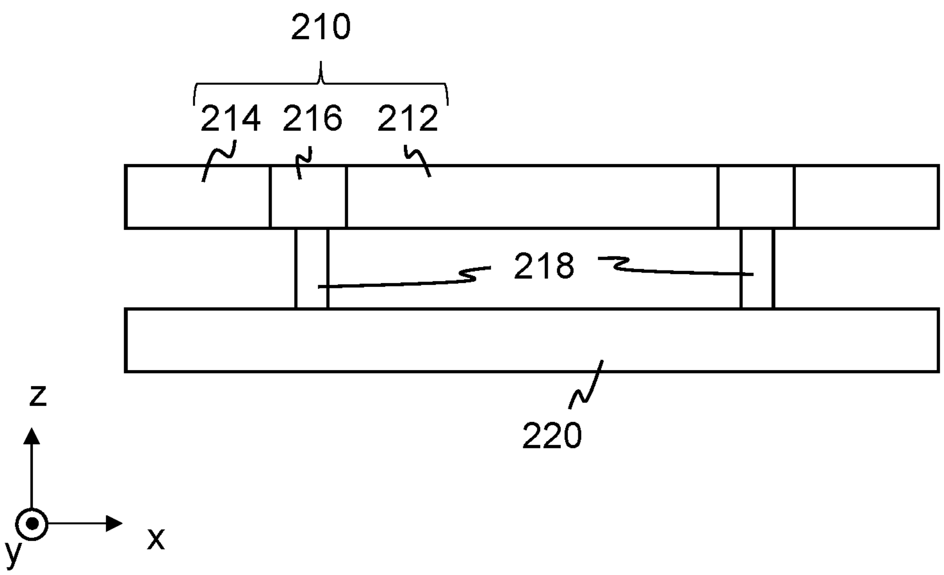
Fig. 10C

DEVICE WITH A STRESS DECOUPLING STRUCTURE

CROSS-REFERENCE TO RELATED APPLICATIONS

This application claims the priority of European Patent Application No. 22208533, filed Nov. 21, 2022, each of which is incorporated herein by reference in its entirety.

TECHNICAL FIELD

Embodiments of the present disclosure relate to a device with a stress decoupling structure. In particular, embodiments relate to a micro-electro-mechanical system (MEMS) device for converting thermal-induced compressive stress into a local spring displacement of a spring structure.

BACKGROUND

Membrane structures are used in many devices that require, for example, measurement of a deflectable structure (e.g., a pressure sensor) or active deflection of a deflectable structure (e.g., a movable mirror mount for directing a mirror). Operation of such devices can cause or require heat generation (e.g. for generating infrared light or by illumination by a laser). Gas sensors with infrared sources often use a blackbody (or grey body) radiator as emitter of infrared light, wherein the temperature of the blackbody is about a few hundred degree Celsius.

Removal of heat can be challenging in particular in MEMS devices, which usually do not use fan devices and may even be hermetically closed. Excess heat can result in thermal expansion and thermal stress, which can cause a buckling or bulking mode if the stress becomes compressive due to thermal loading, which may impede operation and even damage the device. Furthermore, thermal stress can cause structural displacement to such a degree that the membrane structure comes in contact with other structures of the MEMS device, such as a backplate or a housing. The contact can cause damage to either structure and an uncontrolled heat flow from the membrane structure to the contacted other structure. Since the heat flow is uncontrolled, the membrane structure may exhibit excessive cooling and/or a highly asymmetric heat profile. In other words, the buckling or bulking mode may be larger than a thickness of the membrane structure itself, which is usually unwanted and hence may result in contact with other components such as electrodes. This may lead to local cooling due to conduction and/or fractures in the case of large compliance. This may affect operation of MEMS devices that requires a well-defined temperature distribution (e.g., an infrared light emitter).

One approach for addressing thermal stress is to increase a stiffness of the membrane structure in order to mitigate thermomechanical buckling, such as membrane structures with corrugations as well as the use of tensile materials with a higher stiffness. However, corrugations usually constitute additive structures, in which structures and materials are added to reduce a compliance of the heated membrane structure. The added thermal mass can lead to unwanted effects such as a lower modulation speed. Furthermore, corrugations require higher process complexity.

Another approach is to form perforations for ventilation or thermal isolation in the membrane structure (e.g., an infrared emitter). However, the perforations in highly tensile membrane structures may act as fracture initiation sites and affect the lifespan of the MEMS device.

Therefore, there is a need in the field of MEMS devices with membrane structures that have a better lifespan.

SUMMARY

According to an embodiment, a MEMS device is provided. MEMS device comprises a suspended membrane structure having an inner membrane section and an outer membrane section, wherein the outer membrane section surrounds the inner membrane section. The MEMS device further comprises an elastically deformable spring structure in the outer membrane region, wherein the spring structure is arranged to convert a thermal-induced compressive stress in the suspended membrane structure into a (local) spring displacement.

Thus, according to an embodiment, the spring structure is configured to convert thermal-induced compressive stress affecting the suspended membrane structure (and therefore affecting the inner and outer membrane sections) to displacement (and therefore to the outer membrane section). As a result, the thermal-induced compressive stress is reduced in the inner membrane section. Therefore, the risk of unintentional buckling and breaking of the inner membrane section is reduced. Furthermore, with thermal-induced compressive stress being converted to deformation of the spring structure instead to other components of the membrane structure, the spring structure has an increased chance of contacting other parts of the MEMS device (e.g. a housing of the MEMS device). As a result, direct heat dissipation directly from the inner membrane section is reduced, leading to a more homogenous temperature profile of the inner membrane section. Furthermore, heat dissipation is more predictable and controllable, as heat dissipation is rather expected to occur via the spring structure. The MEMS device is robust against mechanical stress has an improved lifespan. The MEMS device can be manufactured without requiring an additional mask or process.

According to an embodiment, a MEMS device is provided. The MEMS device comprises a suspended membrane structure having an inner membrane section and an outer membrane section, wherein the outer membrane section surrounds the inner membrane section. The MEMS device further comprises a strip-shaped intermediate region between the inner membrane section and the outer membrane section, wherein the intermediate region is thermally and mechanically connected to a heat sink by means of one or more connection structures which are mechanically and thermally coupled between the intermediate region structure and the heat sink.

Thus, according to an embodiment, the connection structures allow excess heat that may built up in the membrane to be diverted to the heat sink. As a result, thermal-induced stress and damage caused thereby can be reduced. Since the connection structures are coupled to the intermediate region and not the inner and outer membrane sections, deflection of the inner and outer membrane sections is not significantly inhibited by the connection structure. However, the inner and outer membrane sections benefit from the reduced thermal stress caused by the connection structures. The inner and outer membrane sections are therefore well suited for membrane applications while having reduced thermal stress. The MEMS device is robust against mechanical stress has an improved lifespan.

Further embodiments are described in the dependent claims.

BRIEF DESCRIPTION OF THE DRAWINGS

In the following, embodiments of the present disclosure are described in more detail with respect to the figures, in which:

FIG. 3A shows a top view of an example of a MEMS device with a spring structure comprising a first and second slit, which extend along almost an entire circumference of a membrane structure;

FIG. 3B shows a top view of an example of a MEMS device with a spring structure comprising a first and second slit, which each have a shape of segments of a common circle;

FIG. 3C shows a top view of an example of a MEMS device with a spring structure that comprises overlapped slits;

FIG. 7A shows a top view of a cutout A of FIG. 5B, wherein spring element between slits have equal widths;

FIG. 7B shows a top view of an example of a membrane structure, wherein slits are formed in the shape of rings that are separated into four segments;

FIG. 7C shows a top view of an example of a membrane structure, wherein slits are formed in the shape of rings that are separated into six segments;

FIG. 10A shows a top view of an example of MEMS device;

FIG. 10B shows a top view of an example of a MEMS device connection structure that comprises two pillars;

FIG. 10C shows a schematic cross sectional view of a plane B through the MEMS device depicted in FIG. 10A;

DETAILED DESCRIPTION OF ILLUSTRATIVE EMBODIMENTS

Figure 1:
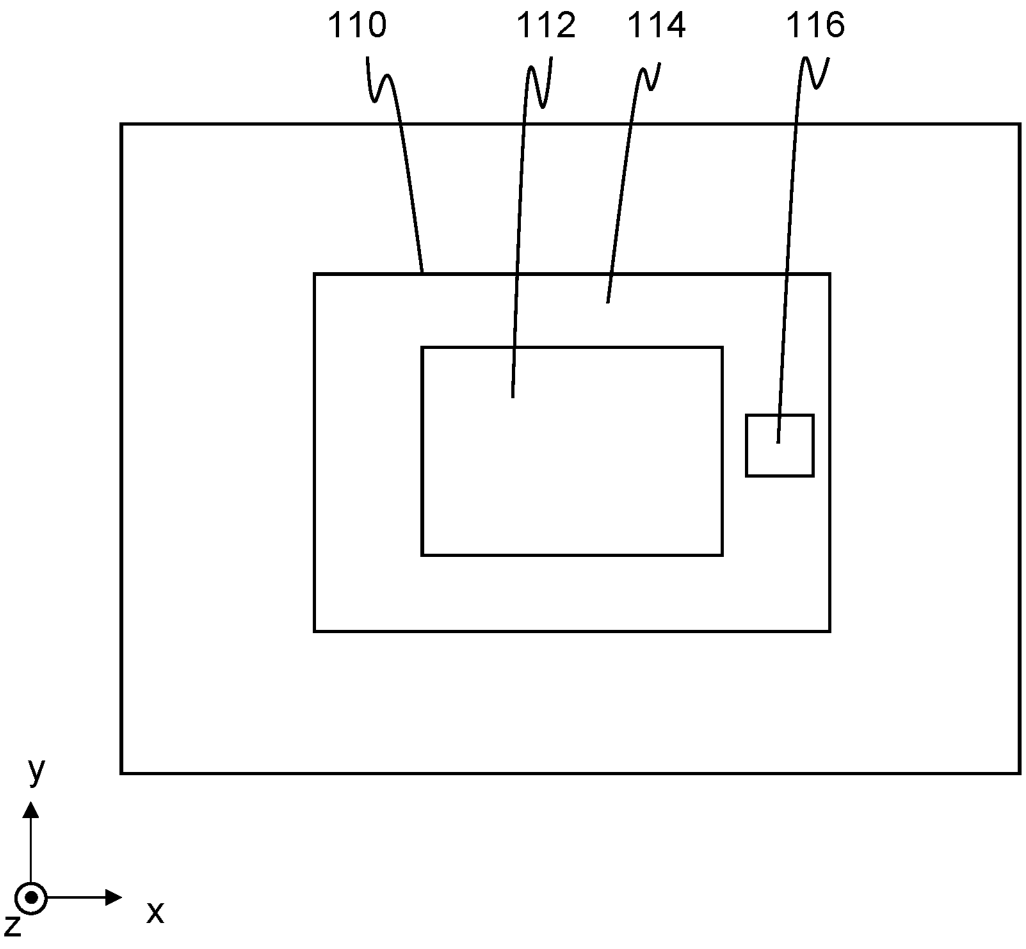
FIG. 1 shows a schematic view of an example of a MEMS device.

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

However, it will be apparent to one skilled in the art that other embodiments may be practiced without these specific details. In other instances, well-known structures and devices are shown in block diagram form rather than in detail in order to avoid obscuring examples described herein. In addition, features of the different embodiments described herein may be combined with each other, unless specifically noted otherwise.

In the description of the embodiments, terms and text passages placed in brackets are to be understood as further explanations, exemplary configurations, exemplary additions and/or exemplary alternatives.

It is understood that when an element is referred to as being "connected" or "coupled" to another element, it may be directly connected or coupled to the other element, or intermediate elements that may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some of the figures comprise a Cartesian coordinate system x, y, z, wherein the x-y-plane corresponds, i.e. is parallel, to a main surface region (e.g. a displaceable or deflectable structure) of a (suspended) MEMS membrane (=a reference plane=x-y-plane), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction or a direction parallel to (or in) the x-y-plane, wherein the term "vertical" means a direction parallel to the z-direction.

Embodiments of the present disclosure relate to a device with a stress decoupling structure. In particular, embodiments relate to a MEMS device for converting thermal-induced compressive stress into a local spring displacement of a spring structure.

FIG. 1 shows a schematic top view of an example of a MEMS device 100. The MEMS device comprises a suspended membrane structure no having an inner membrane section 112 and an outer membrane section 114, wherein the outer membrane section 114 surrounds the inner membrane section 112, and an elastically deformable spring structure 116 in the outer membrane region 114, wherein the spring structure 116 is arranged to convert a thermal-induced compressive stress in the suspended membrane structure into a spring displacement.

In other words, at least some (or all) of thermal-induced compressive stress that would act on the suspended membrane structure no if it had no elastically deformable spring structure 116 is mitigated by being converted to thermal-induced compressive stress acting on the deformable spring structure 116. As a result, at least some (or all) of deformation of the suspended membrane structure 110 that would have occurred if it had no elastically deformable spring structure 116 is mitigated and converted into deformation of the deformable spring structure 116. For example, the elastically deformable spring structure 116 may comprise a region that is deflectable relative to an imaginary plane defined by the suspended membrane structure no, wherein a strain across the suspended membrane structure no causes the deformable spring structure 116 to exhibit a larger (e.g., per area size) deflection (e.g., in form of translation and/or torsion) than the inner membrane section 112.

A membrane structure no with such a deformable spring structure 116 enables reduction of its displacement by transforming and controlling a thermo-mechanical energy into the deformable spring structure 116, e.g. due to the deformable spring structure 116 being softer than the inner membrane section 112 and hence conducting the mechanical stress by transferring the energy towards displacement of the deformable spring structure 116.

The MEMS device 100 may be used in a MEMS heater with a structure to decouple and adjust thermomechanical displacement and other areas where stress decoupling of membranes is important. The MEMS device 100 may be used in infrared emitters and in environmental sensors (e.g., gas sensors based on photoacoustic spectroscopy).

The membrane structure no may have at least essentially a shape of a circular, elliptical, rectangular, square, polygonal or regular polygonal structure. The inner membrane section 112 may have an at least essentially similar shape (but with smaller dimensions) as the membrane structure no. For example, if the membrane structure no has a circular shape, the inner membrane section 112 may also have a circular shape, but with a smaller outer diameter. Alternatively, the membrane structure no and the inner membrane section 112 may have different shapes. Geometric centers of the shapes (e.g., center of a circular structure) of the membrane structure 110 and the inner membrane section 112 may at least essentially coincide (e.g., two circular shaped forms may be arranged concentrically). The outer membrane section 114 may surround the inner membrane section 112 radially (e.g., within a plane of the membrane structure 110).

A lateral surface area of the spring structure 116 may be less than 40%, e.g., less than 20%, e.g., less than 10%, e.g., less than 5% (or a value between any of these values) and at least 1%, for example, of a lateral surface area of the membrane structure no.

Since the spring structure 116 essentially absorbs thermal-induced compressive stress that could affect the inner membrane structure 112, the inner membrane structure 112 is preferably used for operation of the MEMS device 100. With the spring structure 116 occupying less than a maximum surface area (e.g., less than 40%), more of the membrane structure no can be used as inner membrane section 112. Operation of the MEMS 100 device may therefore be improved.

The spring structure 116 may have a mechanical rigidity, which is at least two-times (e.g., or three, four, five, six, or more times) lower than the mechanical rigidity of the remaining membrane structure no. As a result, the spring structure 116 deflects easier than the remaining membrane structure no. It has been found that a mechanical rigidity that is two-times lower forms a good compromise between conversion of thermal-induced stress and stability of the membrane structure no.

The spring structure 116 may form a locally confined displacement region in the outer membrane region 114 of the membrane structure no. A confined displacement region results in a compact device. The spring structure 116 may be locally confined to a frame shaped area (e.g., a stripe shaped area framing an inner area that includes the inner membrane section 112) or a segment thereof. The frame shaped area may have (at least partially) the shape of a ring, a rectangle, an oval, and a polygon. The frame shaped area may imitate a contour of the membrane structure (e.g., with smaller dimensions).

The spring structure 116 may comprise at least one of a trench structure, a slit structure and a lined-up hole structure in the outer membrane region 116. Such structures form longitudinal openings that allow local deformations of the membrane structure 116 along the longitudinal opening. Furthermore, between two (or more) longitudinal openings one or more strips may be formed which have a lower rigidity than areas of the membrane structure 110 that has no spring structure 116.

The trench or slit structure may comprise overlapped trenches or a meander-shaped trench. The trenches or meander-shaped trenches may overlap in a radial direction. For example, the trench structure may comprise two (or more trenches) in the shape of two concentrical rings with patterns comprising dashed lines (wherein each line is an opening and interruptions of the line therebetween do not form openings), wherein the two patterns are offset relative to each other in a circumferential direction.

According to an embodiment, a lateral surface area of the spring structure 116 may be less than 40% of a lateral surface area of the membrane structure. According to an embodiment, the spring structure 116 may have a mechanical rigidity which is at least two-times lower than the mechanical rigidity of the remaining membrane structure.

According to an embodiment, the spring structure 116 may form a locally confined displacement region in the outer membrane section of the membrane structure. According to an embodiment, the spring structure 116 may comprise at least one of a trench structure, a slit structure and a lined-up hole structure in the outer membrane section. According to a further embodiment, the trench structure 116 may comprise overlapped trenches or a meander-shaped trench.

According to an embodiment, the membrane structure 110 may comprise a perforation structure in the inner membrane section 112 to provide a higher mechanical rigidity of the inner membrane section 112 than the outer membrane section 114 and to use the outer membrane section as the spring structure.

According to an embodiment, the spring structure 116 may comprise at least one spring element which is formed by two neighboring and laterally spaced trenches or slits. According to a further embodiment, the spring element 116 may be formed as a strip or leaf spring in the outer membrane section, which partially surrounds the inner membrane section.

According to an embodiment, the spring element 116 may extend in the outer membrane section 114 parallel to a circumferential line of the membrane structure 110 or along a contour line of membrane deflection. According to an embodiment, the spring structure 116 may comprise a plurality of spring elements, which are respectively formed by two neighboring and laterally spaced trenches or slits. According to a further embodiment, the spring elements may be formed as parallel strips or leaf springs and partially surround the inner membrane section. According to an embodiment, the widths of the spring elements may be chosen to provide at least one of equal stiffness, equal electrical resistance and equal distance of the spring elements. According to an embodiment, the spring elements may be distributed in a pattern in the outer membrane section and extend parallel to a circumferential line of the membrane structure 110 or along a contour line of membrane deflection.

According to an embodiment, the suspended membrane structure 110 may be edge clamped to a support structure or substrate and may span across at least a cavity in the support structure or substrate. According to an embodiment, the suspended membrane structure 110 may comprise an integrated resistor which may be arranged to be heated by application of a voltage.

To summarize, a membrane structure 110 is provided having a spring structure 116 that may comprise trenches (or slits) that can compensate a displacement by transforming and controlling a thermo-mechanical energy into spring elements formed between the trenches; the spring elements are weaker and hence conduct the mechanical stress by transferring the energy towards displacement, as structures bend more where weaker. Additionally a thermal insulation towards an adjacent substrate (e.g., a housing and/or heat-sink) can be adjusted by a trench width and number of trenches and as a result the remaining resistor is adjustable as well for a homogeneous temperature profile. Optimization allows focusing on constant stiffness (mechanical domain), constant electrical resistance (electrical and/or optical domain), constant gap size (symmetry), or and all of the above mentioned permutations.

The spring structure 116 may be designed to extend or to be formed along contour lines of a membrane deflection, for example, of a circular, elliptical or rectangular (square) membrane structure 110. For example, in case of a rectangular (square) membrane structure 110, the membrane deflection contour lines are no longer circles but have a more or less rounded-corner rectangular (or square) shape.

In contrast, the present disclosure is directed towards achieving a local deflection of a region of a component in the heating membrane structure (or the component subjected to strong heating—or mirror etc.), for example by forming a spring structure (e.g. cantilever), whereby only this locally deflected area comes (or can come) into contact with the housing and then cools (more strongly), so that the remaining surface area of the heated membrane structure (or the heated component) otherwise has a homogeneous heat distribution and can thus be operated, for example, at a maximum temperature. The ratio of the area (or mass) of the spring structure to the total area (total mass) of the membrane structure may be relatively small (e.g. <10%) as noted above.

Thus, the deflection of an area (of the spring structure) of the component can be achieved selectively, whereby this selective area (e.g., sacrificial area) is subjected to a selective temperature change (reduction).

The thermomechanical surface thus remains (except for the spring structure) in a basic deflection (e.g., no or reduced thermally induced deflection or deflection due to its intended operation) and can thus (except for the area with the target deflection) have a maximally homogeneous temperature distribution or, for example, in the case of a mirror element, a maximally homogeneous (flat or predefined) surface topography. That is, in the case of a mirror element, the structure can be maintained in an initial deflection. Therefore, according to some embodiments, a lot of effort (for example in pressure sensors or microphones) can be avoided on not transferring a package stress to component thereof (e.g., a membrane structure of a pressure sensor or microphone) or on not introducing it there.

In the present description of embodiments, the same or similar elements having the same structure and/or function are provided with the same reference numbers or the same name, wherein a detailed description of such elements will not be repeated for every embodiment. Thus, the above description with respect to FIG. 1 is equally applicable to the further embodiments as described below. In the following description, essentially different implementations or differences, e.g. additional elements, to the embodiment as shown in FIG. 1 and the technical effect(s) resulting therefrom are discussed in detail.

Figure 2:
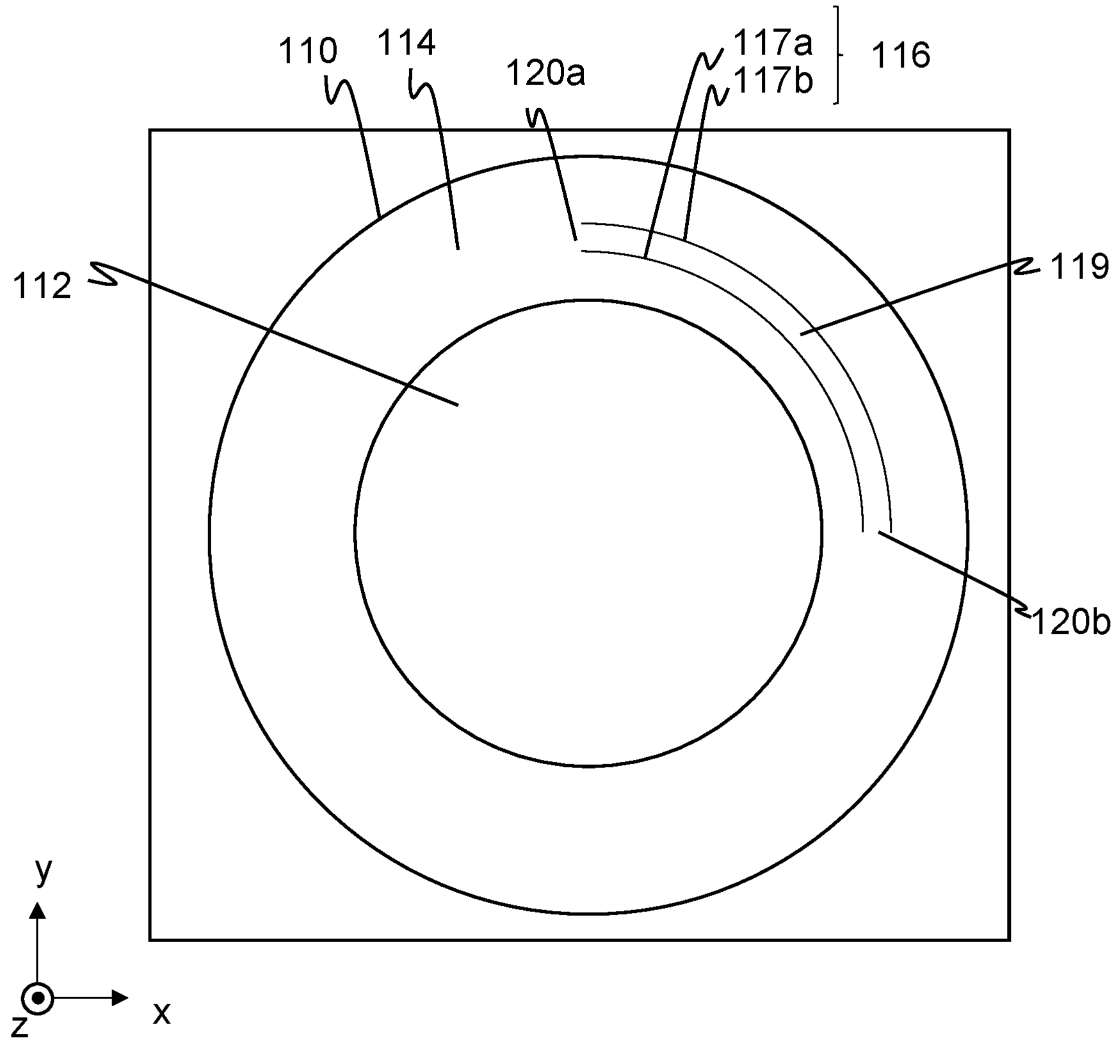
FIG. 2 shows a top view of an example of a MEMS device with a spring structure comprising a first and second slit.

FIG. 2 shows a top view of an example of a MEMS device 100 with a spring structure 116 comprising a first and second slit (or trench) 117*a, b*. A slit or trench may be realized as a longitudinal through hole (e.g., a through trench or through slit). Therefore, the spring structure 116 comprises a spring element 119 (e.g., a strip) which is formed by two neighboring and laterally spaced slits 117*a, b*. The spring element 119 essentially forms a flat spring with two connection points 120*a, b* to the rest of the membrane structure 110. A stress applied between the two connection points 120*a, b* can be alleviated (at least partially) by a deflection (e.g., a buckling in an arch like shape and/or torsion around an extension axis of the spring element) of the spring element 119. A thermal-induced stress acting on the membrane structure 110 can also causes a stress between the two connection points 120*a, b*, which can be alleviated at least partially by deflection of the spring element 119, thereby reducing the thermal-induced stress on the rest of the membrane structure 110.

In other words, the slits or trenches 117*a, b* mechanically weaken the membrane structure 110 for bending modes and allowing, for example, thermomechanical displacement of the spring structure 116 and therefore in a defined area where displacement may be less critical.

FIG. 2 shows a version of the spring structure 116 with two slits 117*a, b*, which only extend over approximately a quarter of a circumference of the disc shaped membrane structure 110. As will be explained in the following, the spring structure 116 can be realized in many different forms.

FIGS. 3A and 3B show examples of spring structures 116 with two radially offset slits 117*a, b*. However, the spring structure 116 may comprise more than two (e.g., three, four, five, six, seven, or more) slits 117 that are radially offset relative to each other.

FIG. 3A shows a top view of an example of a MEMS device 100 with a spring structure 116 comprising a first and second slit (or trench) 117*a, b*, which extend along almost the entire circumference (e.g., 350°) of the membrane structure 110. Alternatively, at least one or more of the slits 117*a, b*, extend along an are that covers different amounts of the circumference, such as at least essentially 45°, 60°, 90°, 120°, 135°, 180°, or 240° (or at least similar in a range of −5% and +5%).

The spring structure 116 may comprise a plurality of spring elements 119, which are respectively formed by two neighboring and laterally spaced trenches or slits 117. A plurality of spring elements 119 allows for a more homogenous distribution of the thermal-induced stress. Furthermore, when the thermal-induced stress is distributed amongst a plurality of spring elements 119, the respective spring elements 119 require less deflection for the conversion of the thermal-induced stress. Therefore, the MEMS device 100 can be more compact.

The spring structure 116 may comprise a plurality of spring elements 119, which are respectively formed by two neighboring and laterally spaced slits or trenches 117. The spring structure 116 may comprise a plurality of spring elements 119 that are laterally spaced apart and/or spaced apart in a circumferential direction.

FIG. 3B shows a top view of an example of a MEMS device 100 with a spring structure 116 comprising a first and second slit 117*a, b*, which each have a shape of segments of a common circle. In the example shown in FIG. 3B, each circle has four segments. Therefore, the spring structure 116 of FIG. 3B has four spring elements 119. Alternatively, a circle may have a different amount of segments, such as two, three, five, six, or more. Furthermore, the circles shown in FIG. 3B have the same number of segments (e.g., four segments). Alternatively, the circles may have different numbers of segments, e.g., a multiple of each other (e.g., four segments and eight segments). In the example shown in FIG. 3B the circle segments and gaps between the circle segments align in a circumferential direction. Therefore, the first and second slit 117*a, b* depicted in FIG. 3B both have a gap at the top, right, bottom and left part (or 12, 3, 6, and 9 o'clock).

FIG. 3C shows a top view of an example of a MEMS device 100 with a slit structure that comprises overlapped slits. The spring structure 116 comprises a first and second slit 117*a, b*, which each have a shape of segments of a common circle that are angularly offset relative to each other. Therefore, the first and second slit 117*a, b* form overlapped slits (or overlapped trenches). In the example shown, the angular offset (e.g., 45°) is half an angle between two gaps (e.g., 90°). Alternatively, the angular offset can be any other value between zero and the angle between two gaps.

FIGS. 3A-C show a spring structure 116 comprising holes in form of slits with a shape of one or more circle segments. Alternatively or additionally, the spring structure 116 may comprise holes with other shapes.

Figures 4A, 4B, 4C, 4D:
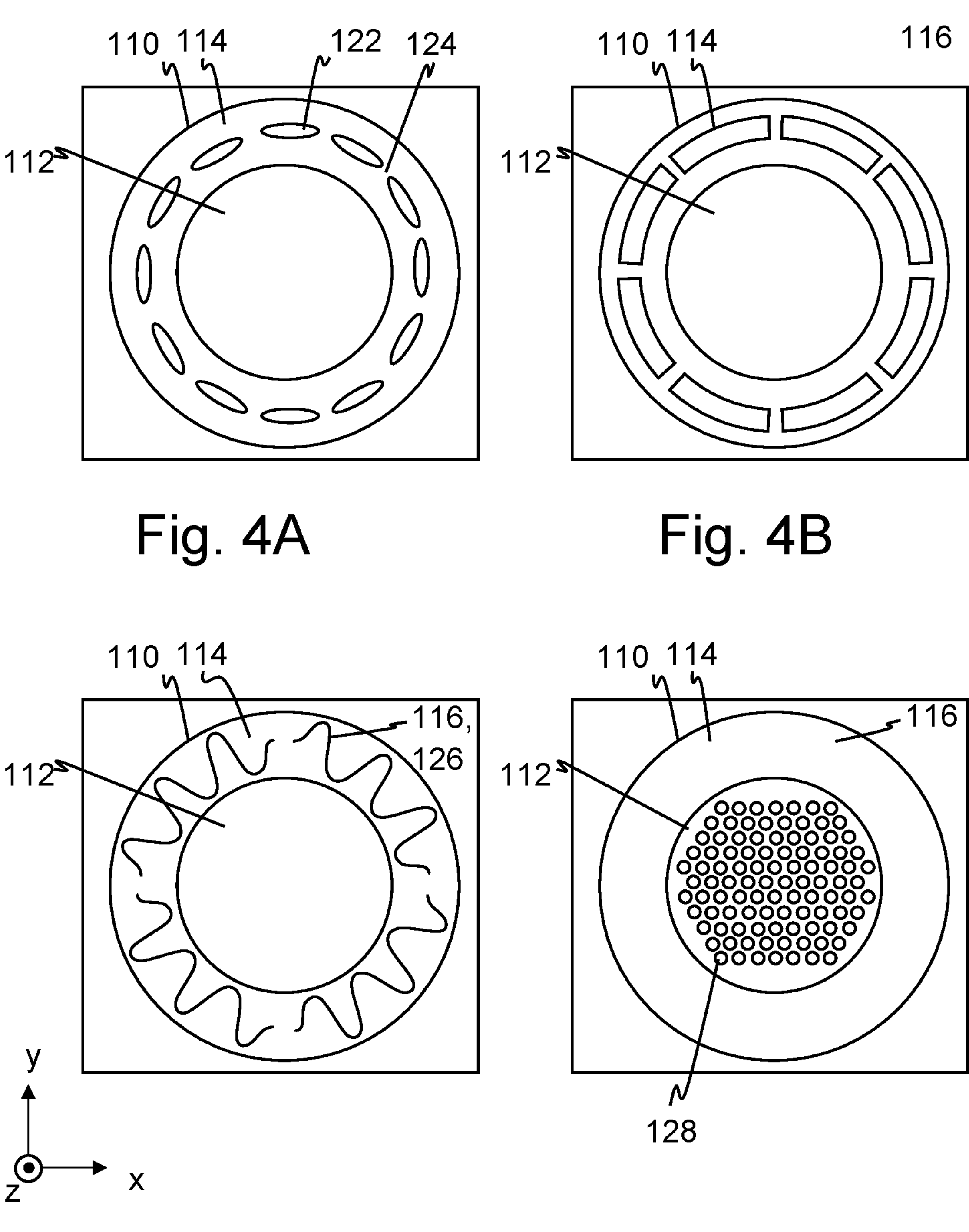
FIG. 4A shows a top view of an example of a MEMS device with a spring structure comprising a plurality of longitudinally shaped holes arranged along an imaginary ring.
FIG. 4B shows a top view of an example of a MEMS device with a spring structure comprising a ring shaped hole with multiple gaps in form of straight bridges.
FIG. 4C shows a top view of an example of a MEMS device with a spring structure comprising one or more holes with a meandering shape.
FIG. 4D shows a top view of an example of a MEMS device with an inner membrane section that comprises holes configured to provide rigidity of the inner membrane section.

FIG. 4A shows a top view of an example of a MEMS device 100 with a spring structure 116 comprising a plurality of longitudinally shaped holes 122 arranged along an imaginary ring. In other words, the spring structure 116 comprises a lined-up hole structure. The membrane structure 110 forms radially extending bridges 124 between the longitudinally shaped holes 122. The bridges 124 are configured to alleviate (at least partially) by a deflection (e.g., a buckling in an arch like shape and/or torsion around an extension axis the bridge 124) of the bridge 124.

FIG. 4B shows a top view of an example of a MEMS device 100 with a spring structure 116 comprising a ring shaped hole with multiple gaps in form of straight bridges. The examples of the spring structures 116 of FIGS. 4A and B are similar, but the bridges in FIG. 4B have straight bridges with at least essentially straight and parallel edges. The edges may extend radially, which still results in an essentially parallel orientation.

FIG. 4C shows a top view of an example of a MEMS device 100 with a spring structure 116 comprising one or more holes 126 with a meandering shape. The meandering shape may define a shape extension path line, wherein the meandering shape is realized by a meandering path that repeatedly crosses the shape extension path line. In the example shown in FIG. 4C, the shape extension path line is a ring circle (or four segments thereof) and the meandering path is the path of the hole 126 that repeatedly crosses the ring circle.

FIG. 4D shows a top view of an example of a MEMS device 100 with an inner membrane section 112 that comprises holes 128 configured to increase the rigidity of the inner membrane section 112. As a result, the outer membrane section 114 forms a spring structure 116 that has a lower rigidity than the inner membrane section 112.

In case of formation of the spring structure by means of perforations (as a stiffener inside the inner membrane section 112—the heating membrane or the mirror element, etc.), the thermally induced deflection can be selectively relocated/shifted to the spring structure 116 (e.g., outer membrane section 114) of the membrane structure 110 in order to obtain the above-mentioned sacrificial area at the spring element 116. The perforations (formed by holes 128) arranged in the inner membrane section 112 of the membrane structure no (for example, a heater membrane) can also be formed as plasmonic structures to possibly also perform a filtering function (in the case of a heater as an IR radiation source).

For example, the perforation (formed by the holes 128) can be formed as corrugation rings in the inner membrane section 112 of the membrane structure no for thermomechanical stiffness. In such a case, the thermally induced bending can be shifted outward (towards the spring structure 116). Thus, by providing a perforation in the inner membrane section 112 of the thermally loaded membrane structure no, a local spring structure 116 can be achieved in adjacent/adjacent outer regions of the membrane structure 110.

A spring structure 116 with an adjustable spring constant can thus be formed as a spring segment and/or a spring area in the thermally loaded membrane structure 110.

Any of the spring structures 16 described herein may be combined. The combination may be realized by arranged different types of spring structures 116 at different radial distances relative to a center point of the membrane structure 110. Alternatively or additionally, different types of spring structures 116 may be arranged at the same of similar radial distances, e.g., by interweaving the different types of spring structures 116.

Figure 5A:
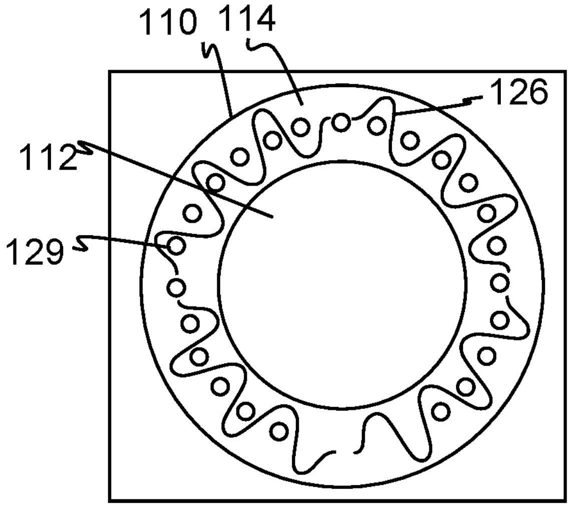
FIG. 5A shows a top view of an example of a MEMS device with a spring structure comprising holes arranged in a circular zig-zag pattern and holes with a meandering shape interweaving between the zig-zag pattern.

FIG. 5A shows a top view of an example of a MEMS device 100 with a spring structure 116 comprising holes 129 arranged along an imaginary ring and holes 126 with a meandering shape interweaving between the holes 129 arranged along the imaginary ring. The holes 129 arranged in along an imaginary ring may be structurally so fragile that thermal stress can cause unintended fracturing. The holes 129 with a meandering shape 126 may reduce such stresses and therefore may reduce the risk of fractures between the holes 129. The holes 129 with the meandering shape 126 may terminate outside an aggregation (or pattern or grid) of the holes 129 arranged along the imaginary ring (as exemplarily depicted at the bottom of FIG. 5A). Strain usually increases at an end of a longitudinal opening. With the meandering shape 126 terminating outside the aggregation, high strain is directed to a region of the membrane structure 110 that is less structurally weakened by the aggregation of the holes 129 arranged along the imaginary ring.

Figure 5B:
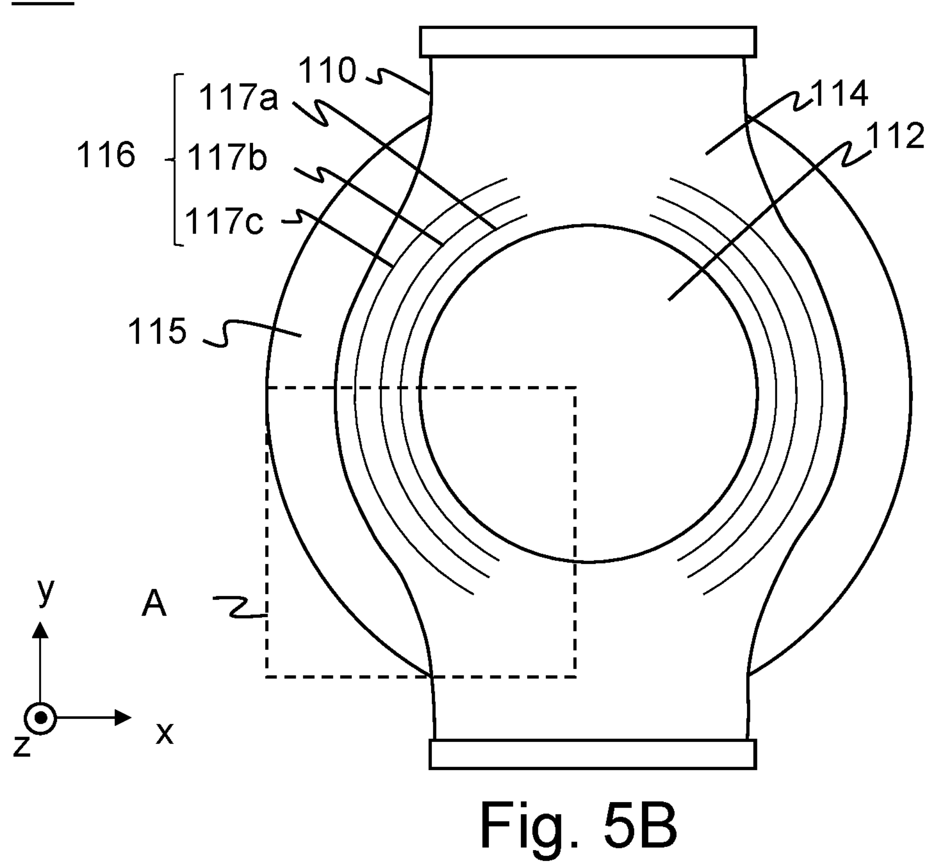
FIG. 5B shows a top view of an example of a MEMS device with a spring structure comprising three slits radially spaced apart.

FIG. 5B shows a top view of an example of a MEMS device 100 with a spring structure 116 comprising three slits 117*a, b, c* radially spaced apart. The three slits 117*a, b, c* extend a long a circular circumference and each comprise two segments of the respective circle. However, any other shape of the circumference, any other number of segments and any other number of slits 117 may be used instead.

It is noted that FIG. 5B shows that the outer membrane section 114 (surrounding the inner membrane section 112) does not necessarily have to be arranged at an outmost area of the membrane structure no. For example, the membrane structure no in FIG. 5B comprises a side region 115 that may surround the outer membrane section 114 or may comprise one or more portions that are arranged radially outside of the outer membrane section 114. The side region 115 may comprise ventilation holes.

The widths of the spring elements may be chosen to provide at least one of equal stiffness, equal electrical resistance and equal distance of the spring elements. For example, radial distances between two slits 117 can be selected to emphasis constant stiffness (e.g., mechanical domain), constant electrical resistance (e.g., electrical and thermal domain) and constant gap size (e.g., symmetry), or different combinations thereof.

Figure 6A:
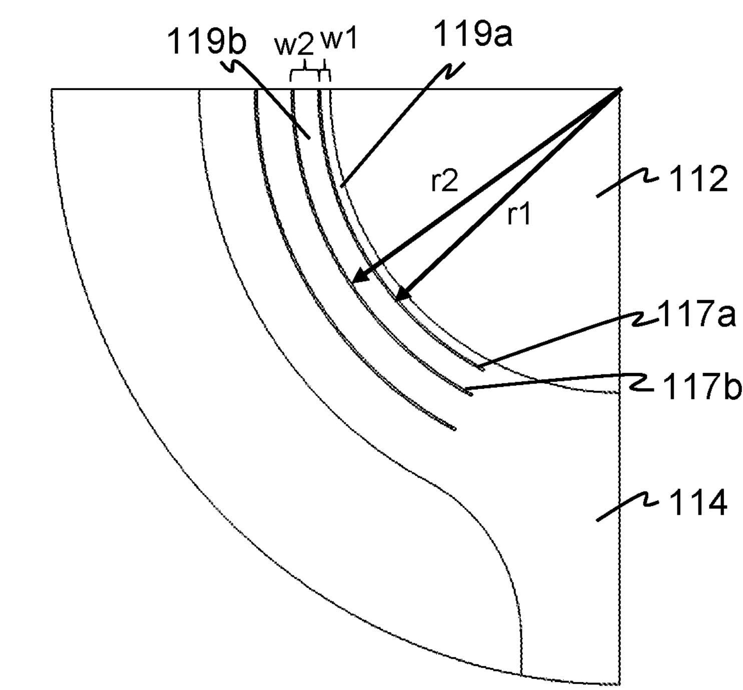
FIG. 6A shows a top view of a cut-out A of FIG. 5B, wherein a ratio of radial distances of slits and a ratio strip widths have a cubic relationship.

FIG. 6A shows a top view of a cutout A of FIG. 5B, wherein a ratio of radial distances of slits and a ratio strip widths (of the spring elements 119*a, b*) may have a non-linear or polynomial relationship. A first slit 117*a* has a radius r1 (to a center of a circle that the first slit 117*a* is a part of) and a second slit 117*b* has a radius r2. A first spring element 119*a* between the first slit 117*a* and a border of the inner membrane section 112 and the outer membrane section 114 has a first width w1. A second spring element 119*b* between the first slit 117*a* and the second slit 117*b* has a width w2. The ratios of the widths w1, w2 may be adjusted based on the radii r1, r2.

Figure 6B:
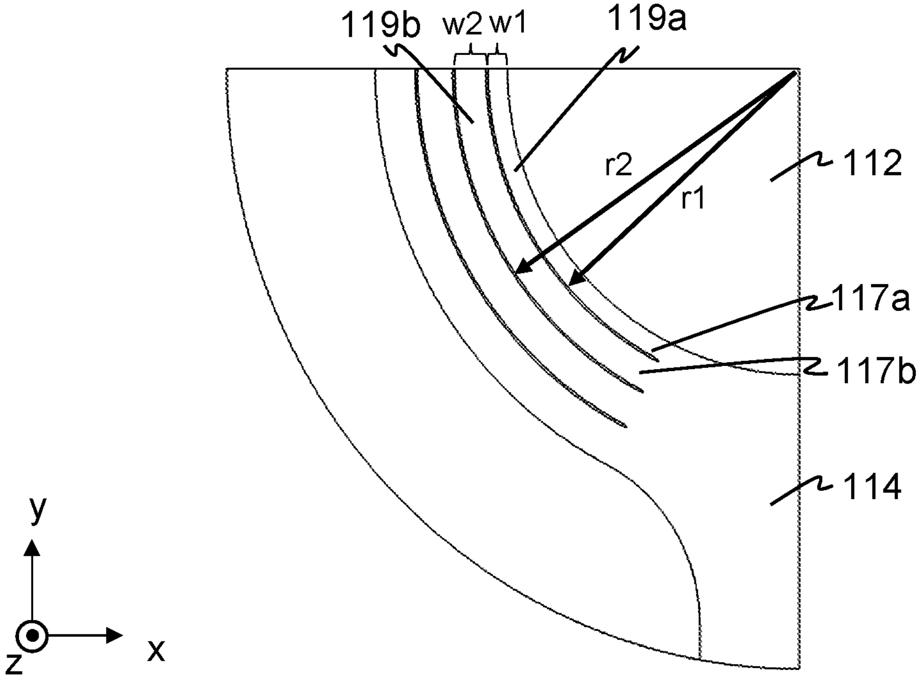
FIG. 6B shows a top view of a cutout A of FIG. 5B, wherein a ratio of radial distances of slits and a ratio of strip widths have a non-linear relationship.

FIG. 6B shows a top view of a cutout A of FIG. 5B, wherein a ratio of radial distances of slits and a ratio of strip widths (of strips between the corresponding spring elements 119) have a different non-linear relationship compared to the one shown in FIG. 6A.

FIG. 7A shows a top view of a cutout A of FIG. 5B, wherein spring element 119 between slits have equal widths.

As can be seen in FIGS. 5B to 7, the spring structure 116 may comprise at least one spring element 119 which is formed by two neighboring and laterally spaced slits (or trenches) 117. The spring element 119 may be formed as a strip or leaf spring in the outer membrane region 114, which partially surrounds the inner membrane region 112. In the examples shown in FIGS. 2 and 3B, the spring element 119 surrounds the inner membrane section 112 approximately (or exactly) by a quarter of a circumference around the inner membrane section 112. However, the spring element 119 may surround the inner membrane 112 at a smaller or larger degree. FIG. 3A shows an example in which the spring element 119 surrounds the inner membrane section 112 by approximately 350°. FIG. 5B shows an example of spring elements 119 surrounding the inner membrane section 112 by (approximately or exactly) 120°. FIG. 3C shows an example of spring elements 119 forming between laterally overlapping slits 117*a, b*, resulting in eight spring elements 119 that each surround the inner membrane section 112 by slightly less than an eighth of a circumference (e.g., 40°).

FIG. 5B shows slits 17 that are formed in the shape of three rings that are segmented into two ring segments. However, the slits of may be formed in any other number of rings (or other circumferential form such as a rectangle, an ellipsis or a polygon) such as three, four, five, six, or more rings. Furthermore, each ring (or other circumferential form) may be segmented in a different number of segments such as three, four, five six, or more.

FIG. 7B shows a top view of an example of a membrane structure 110, wherein slits are formed in the shape of rings that are separated into four segments.

FIG. 7C shows a top view of an example of a membrane structure no, wherein slits are formed in the shape of rings that are separated into six segments.

While all rings in FIGS. 7B, C are separated into the same amount of segments, at least two rings may be separated into different numbers of segments (e.g., four and eight).

The spring elements 119 may extend in the outer membrane region 114 parallel to a circumferential line of the membrane structure no or along a contour line of membrane deflection. As thermal stress may originate and/or distributes according to a contour of the membrane structure 110, spring elements 119 extending parallel to the contour line may reduce stress efficiently.

Figure 8A:
FIG. 8A shows a top view of an example of a membrane structure with a circular circumferential contour line.
Figure 8A:
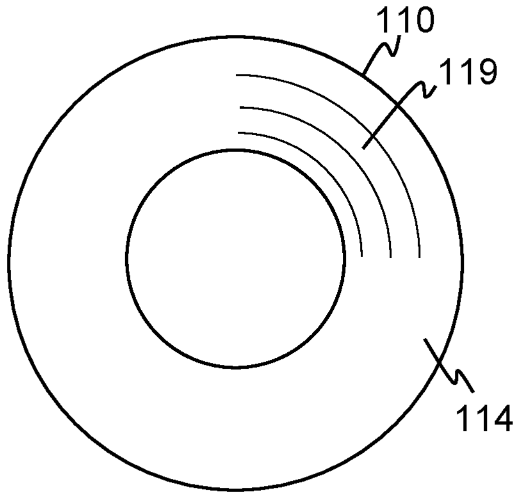

FIG. 8A shows a top view of an example of a membrane structure 110 with a circular circumferential contour line. Spring elements 119 in the outer membrane region 114 also extend in a (e.g., partial) circular circumferential line and therefore extend parallel to the circumferential line of the membrane structure 110. In the example shown in FIG. 8A, the spring elements 119 extend along a path with the shape of a quarter circle.

Figure 8B:
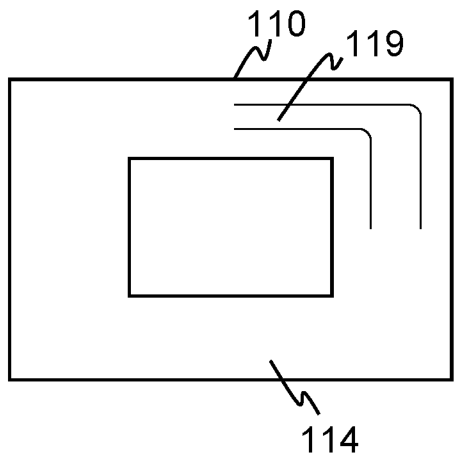
FIG. 8B shows a top view of an example of a membrane structure with a rectangular circumferential contour line.

FIG. 8B shows a top view of an example of a membrane structure 110 with a rectangular (e.g., in the shape of an oblong rectangle or a square) circumferential contour line. Spring elements 119 in the outer membrane region 114 also extend in a (e.g., partial) rectangular circumferential line. In the example shown in FIG. 8B, the spring element 119 extends along an L-shaped path that is arranged parallel to the rectangular circumferential line of the membrane structure 110.

The spring structure 116 may be designed to extend or to be formed along contour lines of a membrane deflection, for example, of a circular, elliptical or rectangular (square) membrane structure no. For example, in case of a rectangular (square) membrane structure no in FIG. 8B, the membrane deflection contour lines are no longer circles but have a more or less rounded rectangular (square) shape.

As can be seen in FIG. 8B, the spring element 119 is formed by two slits that each have an L-shape with a rounded corner. Alternatively, the corner may be formed angular-shaped (i.e. without a rounded corner).

Figure 8C:
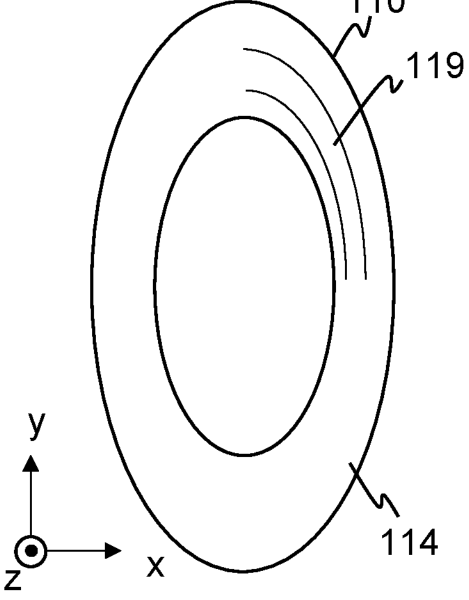
FIG. 8C shows a top view of an example of a membrane structure with an elliptical circumferential contour line.

FIG. 8C shows a top view of an example of a membrane structure 110 with an elliptical circumferential contour line. Spring elements 119 in the outer membrane region 114 also extend in a (e.g., partial) elliptical circumferential line. In the example shown in FIG. 8A, the spring elements 119 extend along a path with the shape of a quarter ellipse.

Figure 8D:
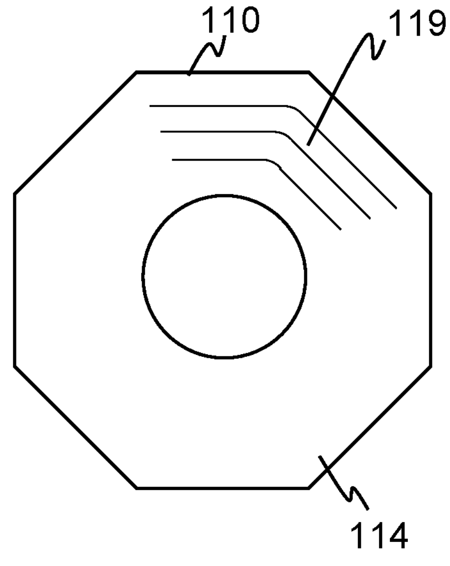
FIG. 8D shows a top view of an example of a membrane structure with an octagonal circumferential contour line.

FIG. 8D shows a top view of an example of a membrane structure 110 with an octagonal circumferential contour line. Spring elements 119 in the outer membrane region 114 also extend in a (e.g., partial) octagonal circumferential line. In the example shown in FIG. 8D, the spring element extends along a path of two lines at an angle of 135°, wherein the path is arranged parallel to the octagonal circumferential line of the membrane structure 110. The two lines may meet at a round corner (as depicted in FIG. 8D) or at an angular-shaped corner.

The spring elements 119 may be formed as parallel strips or leaf springs and partially surround the inner membrane region 112. In FIG. 8A, the spring elements 119 are formed as a plurality of strips that extends in parallel in an arch like path around the inner membrane region 112. In FIG. 8B, the spring elements 119 are formed as strips that extend in in parallel along straight path that bend in a 900 angle.

The suspended membrane structure 110 may be edge clamped to a support structure or substrate and the suspended membrane structure 110 may span at least across a cavity in the support structure or substrate. The membrane structure 110 can be deflected relative to the clamped edge, wherein the spring structure 116 can alleviate thermal-induced stress between clamped edges.

Figure 9:
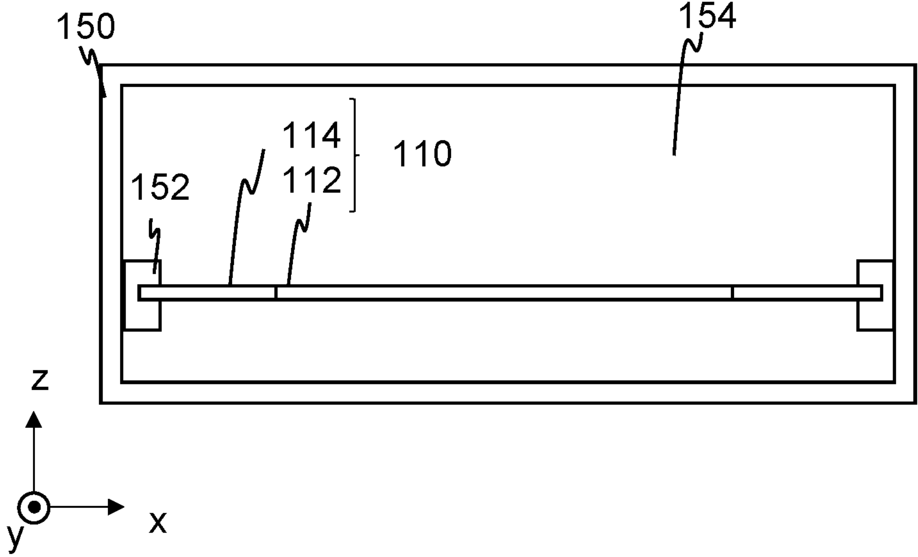
FIG. 9 shows an example of a MEMS device with an edge clamped membrane structure.

FIG. 9 shows an example of a MEMS device 100 with an edge clamped membrane structure 110. A support structure 150 has a clamping structure 152 and a cavity 154. The membrane structure no is edge clamped by the clamping structure 152. The clamping structure 152 may, for example, be a support plate and a top plate that was been fabricated on top of the support plate and the membrane structure no after the membrane structure no has been arranged on top of the support plate. Alternatively or additionally, the clamping structure 152 may be formed by material deposition into openings of a sacrificial layer and subsequent removal of the sacrificial layer.

The support structure 150 further comprises a cavity 154. The cavity 154 can be hermetically closed (e.g., for a microphone) or can have one or more openings (e.g., for emission or reception of electromagnetic radiation and/or fluid connection to a pressure to be measured). The edge clamped membrane structure no spans across the cavity 154 of the support structure 150.

The suspended membrane structure 110 may comprise an integrated resistor which is arranged to be heated by application of a voltage. The integrated resistor may be the membrane structure 110 or a part thereof. Therefore, application of a voltage causes a current to travel through the membrane structure no (or the part thereof), which results in heat generation by the membrane structure no. Alternatively, the integrated resistor may be a separate electrical component that is thermally coupled to the membrane structure no. Possible thermal stress induced by the heating can be alleviated at least partially by the spring structure 116.

In an embodiment, a MEMS device 100 comprises a suspended membrane structure clamped at one or more edges, with an integrated resistor, which can be heated by application of a voltage, in which a selective segmentation of the said membrane structure into (at least) an inner and outer membrane section 112, 114 results in two or more subsections thereof, used to control the heat generation and deformation of the membrane structure no.

According to an embodiment, the MEMS device 100 (e.g., the spring structure 116) is manufactured using a subtractive method (e.g., using at least one of laser cutting, dry etching, wet etching, and optical lithography). The spring structure 116 may be detected and/or verified optically, e.g., by detecting slits or holes that for a spring structure 116, e.g., using a light microscope or electron scanning microscope.

According to an embodiment at least a portion of the membrane structure may comprise or be made of a semiconductor material. The semiconductor material of the membrane structure no (e.g., the inner membrane section 112 and/or the outer membrane section 114) may comprise poly-silicon or monocrystalline silicon. Further materials may be used. The semiconductor material may comprise, for example, silicon (Si), such as poly-silicon (poly-Si), amorphous silicon (a-Si), or monocrystalline silicon, gallium nitride (GaN), gallium arsenide (GaAs) or aluminum nitride (AlN). However, this list of materials for the semiconductor material is not to be regarded as exhaustive. In some embodiments, the semiconductor material may be a conductive semiconductor material.

FIG. 10A shows a top view of an example of MEMS device 200. The MEMS device 200 comprises a suspended membrane structure 210 having an inner membrane section 212 and an outer membrane section 214, wherein the outer membrane section 214 surrounds the inner membrane section 212. The MEMS device 200 further comprises a strip-shaped intermediate region 216 between the inner membrane section 212 and the outer membrane section 214, wherein the intermediate region 216 is thermally and mechanically connected to a heat sink (not shown in FIG. 10A) by means of one or more connection structures 218 (indicated in dashed lines in FIG. 10A) which are mechanically and thermally coupled between the intermediate region 216 and the heat sink.

FIG. 10A shows a top view of an example of a connection structure 218 with the shape of a wall that extends in a ring shaped path extending in circumferential direction in parallel to a shape of the strip-shaped intermediate region. In other words, the connection structure 218 has the shape of a (very short) circumferential or ring-shaped wall that extends perpendicular to the membrane structure 210. The ring shaped connection structure 218 provides an improved heat transfer. However, the connection structure 218 may have other shapes, e.g. arc-shaped or shaped as segments of a circle.

FIG. 10B shows a top view of an example of a MEMS device 100 connection structure 218 that comprises two pillars. The solid or hollow pillars may have a cylindrical shape and may extend perpendicular or non-perpendicular relative to the membrane structure 110. Alternatively, the connection structure 218 may comprise any other number of pillars such as one, three, four, five, six, or more (e.g. equally spaced) pillars. The spaced pillars may improve air circulation to the inner membrane section 212 and may improve deflectability of the membrane structure 110.

FIG. 10C shows a schematic cross sectional view of a plane B through the MEMS device 100 depicted in FIG. 10A (as well as FIG. 10B its pillars also cross plane B).

The connection structure 218 is mechanically coupled to both, the intermediate region 216 and a heat sink 220. At least one of the mechanical couplings may comprise at least one of an adhesive and a welding connection. The connection structure 218 may be fabricated (at least partially) by deposition of material in openings of a sacrificial layer and subsequent removing (e.g., dry or wet etching) of the sacrificial layer). The connection structure 218 may additionally or alternatively, be fabricated using any other MEMS fabrication process.

In FIG. 10C, the heat sink spans across the membrane structure 110. Alternatively, the heat sink may have at least one opening (e.g., at the inner membrane section 212). Such an opening allows optical communication (e.g., emission of infrared radiation) and/or fluid communication of a fluid for a pressure measurement.

The heat sink in FIG. 10C may comprise no other mechanical connection to the membrane structure no. However, the heat sink may comprise other mechanical connections such as a support structure that edge clamps the membrane structure no.

A lateral surface area of the strip-shaped intermediate region 116 may be less than 40%, e.g., less than 20%, e.g., less than 10%, e.g., less than 5% of a lateral surface area of the remaining membrane structure. For example, the lateral surface area of the strip-shaped intermediate region 116 depicted in FIG. 10C is approximately 20% of a lateral surface area of the remaining membrane structure.

The strip-shaped intermediate region 216 may be laterally separated from the remaining membrane structure no by two neighboring and laterally spaced segmentation structures, wherein each segmentation structure may comprise a trench, overlapped trenches, a meander-shaped trench, a lined-up hole structure or a combination thereof.

Figure 11A:
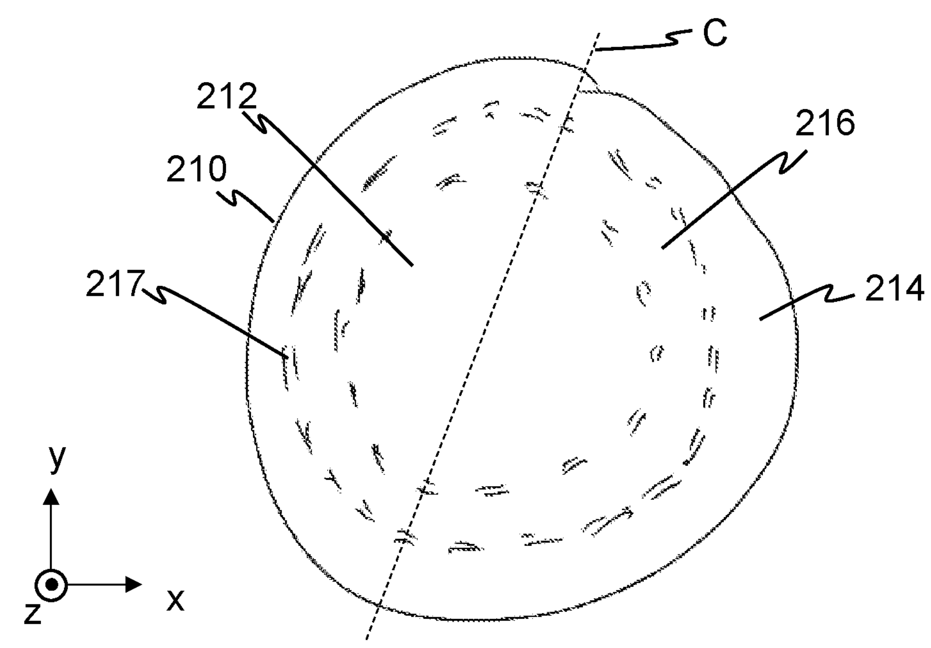
FIG. 11A shows a top view of an example of a MEMS device with laterally spaced segmentation structures.

FIG. 11A shows a top view of an example of a MEMS device 100 with laterally spaced segmentation structures 217. The segmentation structures 217 depicted in FIG. 11 comprise a plurality of slits (or trenches) arranged along two concentrical rings. The strip-shaped intermediate region 216 is formed between the two rings of slits. The segmentation structure 217 may have any other shape such as the spring structure as described herein.

Figure 11B:
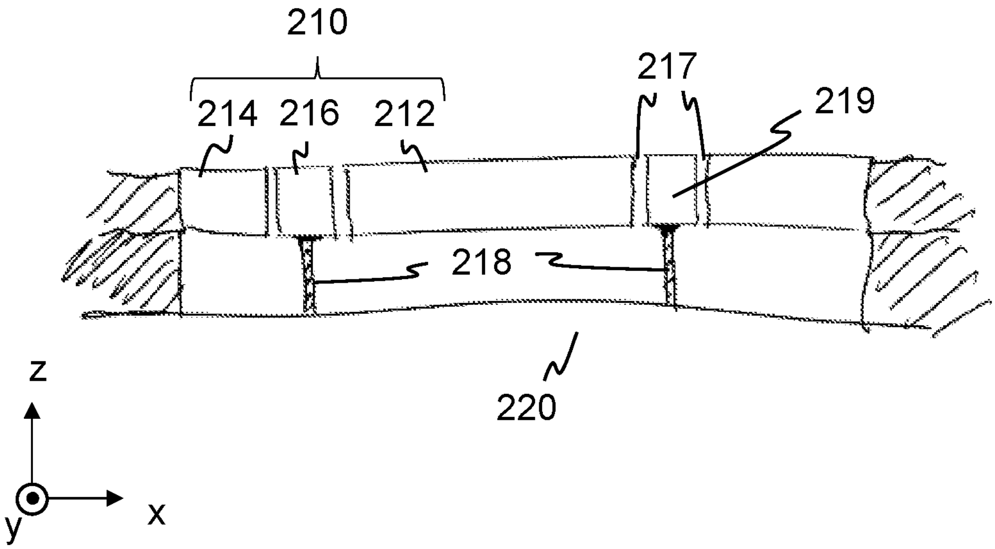
FIG. 11B shows a cross sectional view of a plane C depicted in FIG. 11A In the following description, embodiments are discussed in further detail using the figures, wherein in the figures and the specification identical elements and elements having the same functionality and/or the same technical or physical effect are provided with the same reference numbers or are identified with the same name. Thus, the description of these elements and of the functionality thereof as illustrated in the different embodiments are mutually exchangeable or may be applied to one another in the different embodiments.

FIG. 11B shows a cross sectional view of a plane C depicted in FIG. 11A.

The strip-shaped intermediate region 216 forms one or more spring elements 219 between the slits. The spring elements 219 are therefore movable relative to the inner and/or outer membrane sections 212, 214. As a result, the inner and/or outer membrane sections 212, 214 may have improved deflectability relative to the spring elements 219, which are mechanically coupled to the heat sink. The membrane structure 210 may therefore be less rigid.

The strip-shaped intermediate region 216 may form a locally confined heat-sink region between the inner and outer membrane region of the membrane structure. In the examples shown in FIGS. 10A to 11B, the connection structures 218 are mechanically connected to the strip-shaped intermediate region 216. The inner and/or outer membrane sections 212, 214 do not comprise a connection structure for thermally coupling to the heat sink 220. As a result, heat transfer between the inner and/or outer membrane sections 212, 214 and the heat sink may occur in form of thermal convection and/or thermal radiation, but not in form of thermal conduction. As a result, a temperature distribution across the inner and/or outer membrane sections 212, 214 is more homogenous than across the strip-shaped intermediate region 216 (which is cooler due to heat transfer via the connection structures 218). A homogenous temperature distribution may reduce thermal stress and improves accuracy of applications that may require a homogenous temperature distribution (e.g., for infrared emission). Alternatively, the inner and/or outer membrane sections 212, 214 may comprise one or more connection structures that mechanically and thermally couple the inner and/or outer membrane sections 212, 214 to the heat sink 220.

Regarding the embodiment of FIGS. 11A-B, the segmentation structures 217 can be designed as prestressed (e.g., fixed) springs which form a thermal connection to a heat sink (e.g., a solid structure) by means of connection structures 218 (e.g., columns) in order to obtain a bypass (=temperature dissipation) specifically from a small section of the surface area of the temperature-impacted area element (of the membrane structure 210) via the thermally highly conductive connection structures 218 to the heat sink 220. In this way, a maximally homogeneous temperature distribution (except for the "sacrificial areas" where the membrane structure 210 is coupled to the connection structures 218) can be obtained in the membrane structure 210. The heat sink 220 can be, for example, another membrane opposite the (e.g., heating) membrane structure 210 (above the Bosch cavity) or can extend to an oxide layer of a bulk silicon of the MEMS device 200 or a system comprising the MEMS device 200.

Additional embodiments and aspects are described which may be used alone or in combination with the features and functionalities described herein.

According to an embodiment, a MEMS device comprises a suspended membrane structure having an inner membrane section and an outer membrane section, wherein the outer membrane section surrounds the inner membrane section, and an elastically deformable spring structure in the outer membrane section, wherein the spring structure is arranged to convert a thermal-induced compressive stress in the suspended membrane structure into a (local) spring displacement.

According to an embodiment, at least a lateral surface area of the spring structure is less than 40% of a lateral surface area of the membrane structure.

According to an embodiment, the spring structure has a mechanical rigidity which is at least two-times lower than the mechanical rigidity of the remaining membrane structure.

According to an embodiment, the spring structure forms a locally confined displacement region in the outer membrane section of the membrane structure.

According to an embodiment, the spring structure comprises at least one of a trench structure, a slit structure and a lined-up hole structure in the outer membrane section.

According to an embodiment, the trench structure comprises overlapped trenches or a meander-shaped trench.

According to an embodiment, the membrane structure comprises a perforation structure in the inner membrane section to provide a higher mechanical rigidity of the inner membrane section than the outer membrane section and to form the outer membrane section as the spring structure.

According to an embodiment, the spring structure comprises at least one spring element which is formed by two neighboring and laterally spaced trenches or slits.

According to an embodiment, the spring element is formed as a strip or leaf spring in the outer membrane section, which partially surrounds the inner membrane section.

According to an embodiment, the spring element extends in the outer membrane section parallel to a circumferential line of the membrane structure or along a contour line of membrane deflection.

According to an embodiment, the spring structure comprises a plurality of spring elements, which are respectively formed by two neighboring and laterally spaced trenches or slits.

According to an embodiment, the spring elements are formed as parallel strips or leaf springs and partially surround the inner membrane section.

According to an embodiment, the widths of the spring elements are chosen to provide at least one of equal stiffness, equal electrical resistance and equal distance of the spring elements.

According to an embodiment, the spring elements are distributed in a pattern in the outer membrane section and extend parallel to a circumferential line of the membrane structure or along a contour line of membrane deflection.

According to an embodiment, the suspended membrane structure is edge clamped to a support structure or substrate and spans at least a cavity in the support structure or substrate.

According to an embodiment, the suspended membrane structure comprises an integrated resistor which is arranged to be heated by application of a voltage.

According to an embodiment, a MEMS device comprises a suspended membrane structure having an inner membrane section and an outer membrane section, wherein the outer membrane section surrounds the inner membrane section, and a strip-shaped intermediate region between the inner membrane section and the outer membrane section, wherein the intermediate region is thermally and mechanically connected to a heat sink by means of one or more connection structures which are mechanically and thermally coupled between the intermediate region structure and the heat sink.

According to an embodiment, a lateral surface area of the strip-shaped intermediate region is less than 40% of a lateral surface area of the remaining membrane structure.

According to an embodiment, the strip-shaped intermediate region is laterally separated from the remaining membrane structure by two neighboring and laterally spaced segmentation structures, wherein each segmentation structure comprises a trench, overlapped trenches, a meander-shaped trench, a lined-up hole structure or a combination thereof.

According to an embodiment, the strip-shaped intermediate region forms a locally confined heat-sink region between the inner and outer membrane region of the membrane structure.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein.

What is claimed is:

1. A micro-electro-mechanical system (MEMS) device comprising:

a suspended membrane structure having an inner membrane section and an outer membrane section, wherein the outer membrane section at least partially surrounds the inner membrane section; and a spring structure that is elastically deformable in the outer membrane section, wherein the spring structure is arranged to respond to a thermal-induced compressive stress in the suspended membrane structure with a spring displacement of the spring structure.

2. The MEMS device of claim 1, wherein a lateral surface area of the spring structure is less than 40% of a lateral surface area of the membrane structure.

3. The MEMS device of claim 1, wherein the spring structure has a mechanical rigidity about two-times less than a mechanical rigidity of the remaining membrane structure.

4. The MEMS device of claim 2, wherein the spring structure forms a locally confined displacement region in the outer membrane section of the membrane structure.

5. The MEMS device of claim 1, wherein the spring structure comprises a trench structure.

6. The MEMS device of claim 5, wherein the trench structure comprises overlapped trenches or a meander-shaped trench.

7. The MEMS device of claim 1, wherein the spring structure comprises at least one spring element formed by two neighboring and laterally spaced trenches or slits.

8. The MEMS device of claim 7, wherein the spring element is formed as a strip or leaf spring in the outer membrane section.

9. The MEMS device of claim 7, wherein the spring element extends in the outer membrane section parallel to a circumferential line of the membrane structure or extends along a contour line of membrane deflection.

10. The MEMS device of claim 7, wherein the spring structure comprises a plurality of spring elements respectively formed by two neighboring and laterally spaced trenches or slits.

11. The MEMS device of claim 10, wherein the spring elements are formed as parallel strips or leaf springs, and wherein the spring elements partially surround the inner membrane section.

12. The MEMS device of claim 10, wherein respective widths of the spring elements are chosen to provide at least one of: equal stiffness, equal electrical resistance, and equal distance of the spring elements.

13. The MEMS device of claim 10, wherein the spring elements are distributed in a pattern in the outer membrane section and extend parallel to a circumferential line of the membrane structure or along a contour line of membrane deflection.

14. The MEMS device of claim 1, wherein the suspended membrane structure is edge clamped to a support structure and spans across a cavity in the support structure.

15. The MEMS device of claim 1, wherein the suspended membrane structure comprises an integrated resistor which is arranged to be heated by application of a voltage.

16. The MEMS device of claim 1, wherein the spring structure comprises a slit structure.

17. The MEMS device of claim 1, wherein the spring structure comprises a lined-up hole structure.

18. A MEMS device comprising:

a membrane structure having an inner membrane section and an outer membrane section at least partially surrounding the inner membrane section; and a spring structure formed in the outer membrane section by at least two parallel trenches penetrating the outer membrane section, wherein the spring structure is configured to respond to a thermal stress in the membrane structure with a mechanical deformation between the two parallel trenches.

19. The MEMS device of claim 18, wherein the membrane structure is edge clamped to a support structure and spans across a cavity in the support structure.

20. The MEMS device of claim 18, wherein the membrane structure comprises an integrated resistor which is arranged to be heated by application of a voltage.

* * * * *